(12) United States Patent
Adiga Manoor et al.

(10) Patent No.: US 11,394,375 B2
(45) Date of Patent: Jul. 19, 2022

(54) SINUSOIDAL WAVE FORMATION FOR REDUCTION OF OSCILLATIONS, HARMONICS AND DISTORTION USING SHORT PULSES TO REDUCE THE NUMBER OF REQUIRED IMPEDANCE INJECTION UNITS

(71) Applicant: Smart Wires Inc., Union City, CA (US)

(72) Inventors: Shreesha Adiga Manoor, Milpitas, CA (US); Mahsa Ghapandar Kashani, Millbrae, CA (US); Antonio Ginart, Santa Clarita, CA (US); Haroon Inam, San Jose, CA (US); Mehrdad Yazdanian, Irvine, CA (US)

(73) Assignee: Smart Wires Inc., Union City, CA (US)

( * ) Notice: Subject to any disclaimer, the term of this patent is extended or adjusted under 35 U.S.C. 154(b) by 0 days.

(21) Appl. No.: 17/301,148

(22) Filed: Mar. 26, 2021

(65) Prior Publication Data
US 2022/0116028 A1    Apr. 14, 2022

Related U.S. Application Data

(60) Provisional application No. 63/198,374, filed on Oct. 14, 2020.

(51) Int. Cl.
*H03K 5/00* (2006.01)
*H03K 5/01* (2006.01)
*H03K 4/04* (2006.01)
*H03K 4/02* (2006.01)
*H03K 4/92* (2006.01)

(52) U.S. Cl.
CPC ................. *H03K 5/01* (2013.01); *H03K 4/02* (2013.01); *H03K 4/04* (2013.01); *H03K 4/92* (2013.01)

(58) Field of Classification Search
None
See application file for complete search history.

(56) References Cited

U.S. PATENT DOCUMENTS

2020/0067309 A1\*  2/2020  Ginart ............... H02J 13/00004
2020/0395756 A1\* 12/2020  Harrington ............... H02J 3/28
2021/0159706 A1\*  5/2021  Ginart ................... H02J 3/1814

\* cited by examiner

*Primary Examiner* — Tuan T Lam
(74) *Attorney, Agent, or Firm* — Womble Bond Dickinson (US) LLP

(57) ABSTRACT

A method for synchronized injection of impedance into high voltage (HV) transmission line is disclosed. The method includes generating, by a plurality of impedance injection units (IIUs) coupled to the HV transmission line, impedance injection waves that cumulatively form a pseudo-sinusoidal wave. The method further includes optimizing, by the plurality of IIUs, the pseudo-sinusoidal wave to represent a pure sinusoidal wave. The method further includes injecting, by the plurality of IIUs, the pseudo-sinusoidal wave, as impedance, into the HV transmission line. The plurality of IIUs form multiple connection configurations in sequence, each connection configuration comprising one IIU or multiple IIUs in series, parallel or combination thereof, coupled to the HV transmission line.

18 Claims, 16 Drawing Sheets

(a 2x2 IIU implementation of IIM)

(a 2x2 IIU implementation of IIM)

A 4X2 IIU implementation of IIM $V_{ave} = V_{max}(0.636943)$
$V_0 = 0.636943$

Sinusoidal Wave

| Waveform | Effective value $V_{RMS}$ | Average Value $V_{AVE}$ | Conversion Factor $\frac{V_{RMS}}{V_{AVE}}$ | $V_{AVE}$ Reading Error | CREST FACTOR CF |
|---|---|---|---|---|---|
| A 0 ~ | $A/\sqrt{2}$ = 0.707 | $2A/\pi$. = 0.637 | $\pi/2\sqrt{2}$ = 1.111 | 0% | $\sqrt{2}$ = 1.414 |

N=2

| Level | α | β-2α | | Vo Ref |
|---|---|---|---|---|
| 1 | 0.25268 | 2.6362321 | 0.833139 | 0.419569 |
| 2 | 0.848062 | 1.4454685 | 0.460107 | 0.230053 |
| Total Vo | | | | 0.649623 |

N=3

| Level | α | β-2α | | Vo Ref |
|---|---|---|---|---|
| 1 | 0.167448 | 2.8066965 | 0.883399 | 0.2978 |
| 2 | 0.523599 | 2.0943951 | 0.666667 | 0.222222 |
| 3 | 0.985111 | 1.1713711 | 0.372859 | 0.124286 |
| Total Vo | | | | 0.644308 |

$$V_0 = \frac{V_D \cdot (\pi - 2\alpha_n)}{N \cdot \pi}$$

$$\alpha_n = \sin^{-1}\left(\frac{2n-1}{2N}\right)$$

Ideality factor Table
Ifopt=0.636943

| Injecting IIU groups 'n" | 2 | 3 | 4 | 5 |
|---|---|---|---|---|
| Ideality of waveform (IFn) | IF2=0.649623 | IF3=0.644308 | IF4=0.641855 | IF5=0.640485 |
| Ratio{(IFn-IFopt)/IFopt} | 1.99% | 1.16% | 0.77% | 0.56% |

Fig. 11C

SINUSOIDAL WAVE FORMATION FOR REDUCTION OF OSCILLATIONS, HARMONICS AND DISTORTION USING SHORT PULSES TO REDUCE THE NUMBER OF REQUIRED IMPEDANCE INJECTION UNITS

CROSS REFERENCE TO RELATED APPLICATIONS

This application claims benefit of priority from U.S. Provisional Application No. 63/198,374, entitled "Sinusoidal Wave Formation for Reduction of Oscillations, Harmonics and Distortion Using Short Pulses to Reduce the Number of IIUs Required", filed on Oct. 14, 2020, the disclosure of which is incorporated herein by reference.

TECHNICAL FIELD

The present disclosure relates to using available resources from a plurality of transformer-less flexible alternating current transmission system (TL-FACTS) based impedance injection units (IIUs) connected in series in one or more impedance injection modules (IIMs) to generate and inject sinusoidal waveform with minimum harmonic injection on a high voltage (HV) transmission line.

BACKGROUND

The current move in the industry is to use modular TL-FACTS based impedance injection units (IIUs) for distributed and localized line balancing and localized control of disturbances in high voltage (HV) transmission lines (such as HV transmission lines 108 of power grid 100 shown in FIG. 1). This local control is in addition to utility-based control of power flow over the HV transmission lines. In FIG. 1, local control of the HV transmission lines 108 is achieved by use of intelligent impedance injection modules (IIMs) 300 connected in series with the HV transmission lines 108 and comprise a plurality of IIUs typically connected in a series-parallel configuration. Parallel connected IIUs switch in synchronized fashion and are used to provide increased current carrying capacity for the transmission lines 108 while series connected IIUs can be used to increase the injected impedance voltage in a cumulative fashion. Impedance refers to the measure of the opposition that a circuit presents to a current when a voltage is applied. The term complex impedance may be used interchangeably. Impedance extends the concept of resistance to AC circuits, and possesses both magnitude and phase. Impedance can be inductive, capacitive, resistive or combinations of any of them.

In FIG. 1, IIMs 300s are coupled to the HV transmission line 108, typically in a distributed fashion, each IIM 300 being coupled to a segment of the HV transmission line to provide control capability to that segment, thereby enabling local control, as shown. The distributed IIMs 300 are connected in series with the HV transmission line 108, their injected impedance voltages are also cumulative over the HV transmission line 108. As shown in FIG. 1, power grid system 100 includes IIMs 300 distributed over HV transmission lines 108 between substations 204. The IIMs 300 are directly attached to the HV transmission lines 108 of the power grid system 100 and are suspended and insulated from ground on HV transmission lines 108, which are suspended from HV transmission towers 201. Generators 203 and loads 205 are typically connected to the HV transmission lines 108 at the substations 204. Groups of local IIMs 300 are communicatively connected or coupled to a local intelligence center (LINC) 302 via high-speed communication links 303 that allow for communication and response by the IIMs 300 in the local area at sub-synchronous speeds when required. The LINCs 302 are also connected by high-speed communication links 303 to other neighboring LINCs 302 for coordination of activity of the local groups of IIMs 300. A supervisory utility 206 oversees the activity of the power grid system 100 using command and communication links 305 and 207 connecting to the LINCs 302 and substations 204, respectively. The supervisory utility 206 is able to have interactive control of the local area IIMs 300 via the communication links connecting it to the LINCs 302. The supervisory utility 206 has superseding control of the LINCs 302 and the IIMs 300 at any time.

The term "high-speed communication" as detailed above refers to a communication speed that enable the IIMs 300 in the local area and LINC 302 having supervisory control to communicate with each other and respond in a coordinated fashion in sub-cyclic duration to any changes or disturbances sensed on the HV transmission line. This requirement mandate that the communication speeds also be at sub-cyclic speeds.

The term "local or local region" in this instance refer to a segment of the transmission line under control of a single IIM (300)

The term "local area" is defined as belonging to or relating to, a particular area or neighborhood. Herein, the term "local area" refers to the area within which the IIMs coupled to segments of a HV transmission line and other FACTS based devices in the neighborhood that are coupled to the HV transmission line are under the supervisory control of a single LINC.

FIG. 2 is a block diagram showing the main components of an intelligent IIM. Referring to FIG. 2, IIM 300 includes at least an impedance generation and injection module or unit 401, an intelligent control capability 402 having at least a clock with time synchronization capability, and a high-speed communication link 410.

FIG. 3A shows a local clock 404A coupled to an intelligent control module (or intelligent controller) 403 within each IIM 300 to synchronize the generation and injection of impedance into HV transmission line 108. FIG. 3B shows a global clock 404B, controlled typically by global positioning system (GPS) 407, coupled to an intelligent control module 403 to synchronize the local clock with other local clocks for generation and injection of impedance into HV transmission line 108. Each of the IIMs 300 uses power extracted from the HV transmission line 108 at the local region to provide power to the circuits of the IIM 300 including the intelligent control module 403, communication link 410 and the IIUs 400. Power can be extracted from the HV transmission line 108 by using a power transformer 301A coupled to a sensor and power supply module 301.

FIG. 4 shows a circuit diagram of a TL-FACTS based IIU connected in series on a HV transmission line. Referring to FIG. 4, IIU 400 is capable of generating inductive or capacitive impedance to be injected into the HV transmission line 108. The IIU 400 comprise two leads 406A and 406B that are connected in series with the HV transmission line 108. Four IGBT switches 408B are used to connect the input line 406A to the output line 406B. The switching of the four IGBT switches 408B are controlled by switch controls 408A-1 to 408A-4 that are coupled to a master control 402. The master control 402 is coupled to a sensor and power supply 301 which extracts power from the HV transmission line 108 for the operation of the IIU 400 via transformer 304. A direct current (DC) capacitor develops a DC voltage across it that is used as injected impedance into the HV transmission line 108. Depending on the sequence of switching of the IGBT switches 408B, an inductive or capacitive impedance can be generated and injected into the HV transmission line 108. Typically, each IIM 300 includes a plurality of IIUs 400 connected in a series-parallel configuration.

FIG. 5 shows an IIM 300 having a 2×2 configuration of IIUs 400. The IGBT switches of the IIUs 400 are enabled to switch in order to generate rectangular impedance waveforms which get injected into an HV transmission line. IGBT switches 408B have to be de-rated during application for their current carrying capacity to improve reliability. IGBT switches paralleling within IIUs 400, and multiple IIUs paralleling with switch synchronization in each IIM 300 are used to ensure adequate current capability through the IIMs 300 connected in series with the HV transmission line. The paralleled groups of IIU 400 may be connected in series within each IIM 300 to increase the generated and injected impedance voltage from the IIM 300. The result of such a connection configuration is to increase both the current carrying capacity and the generated injected impedance voltage from the IIM 300.

The injected waveforms from the series connected IIUs 400 groups, e.g., group 400A and group 400B, are additive and make up a rectangular impedance injection waveform of typically double the amplitude if the start and stop times are synchronized. Such a large amplitude rectangular injection into the HV transmission line, however, may result in oscillations being initiated and harmonics being injected on the HV transmission line. It is therefore ideal if such oscillations and harmonic injections are avoided on the HV transmission lines of a power grid for improved stability and reliability of operation of the power grid. This can be accomplished by staggering the impedance injection from various series connected IIUs or groups of parallel connected IIUs where the groups are connected in series.

In some cases, however, individual capability of a single IIM 300 is insufficient to provide the impedance injection required. The resources from multiple distributed IIMs 300 which are connected in series on a HV transmission line may be utilized to generate the total impedance injection needed. Staggering of start and stop times duration of injection is needed in these cases to limit oscillations and injection of harmonics on the HV transmission line. Use of a synchronizable clock across IIMs 300 can enable such staggering of injected waveforms within an IIM 300 and/or between multiple IIMs 300 by modifying the start and end times of the series connected IIU groups. The IIU groups (such as IIUs 400A-1, 400-A2, 400-B1, 400-B2) are connected in parallel and switched simultaneously (as previously discussed).

It would therefore be ideal if the injection synchronization from the series connected IIUs and IIMs can be optimized to limit unwanted oscillations and harmonics being injected into the HV transmission line 108 while the number of IIUs needed to inject a pseudo-sinusoidal waveform that closely approximates a sinusoidal waveform can be reduced.

BRIEF DESCRIPTION OF THE DRAWINGS

Embodiments of the disclosure are illustrated by way of example and not limitation in the figures of the accompanying drawings in which like references indicate similar elements.

FIG. 11C is a table showing the result of increasing the number of injectors as shown in FIGS. 11A and 11B.

DETAILED DESCRIPTION

Figure 1:
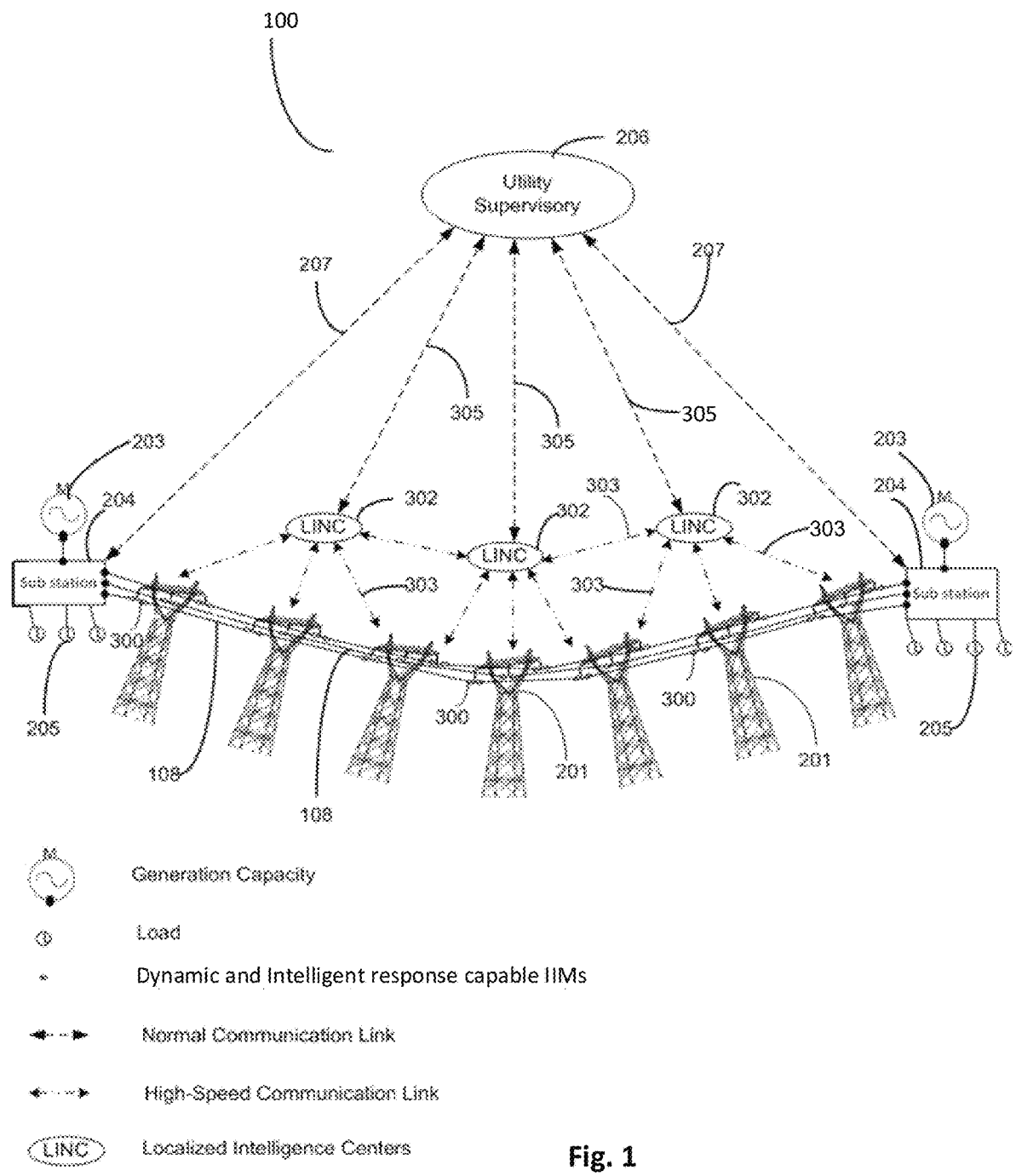
FIG. 1 is a diagram illustrating a conventional power grid system with a distributed and hierarchical intelligent control system.
Figure 2:
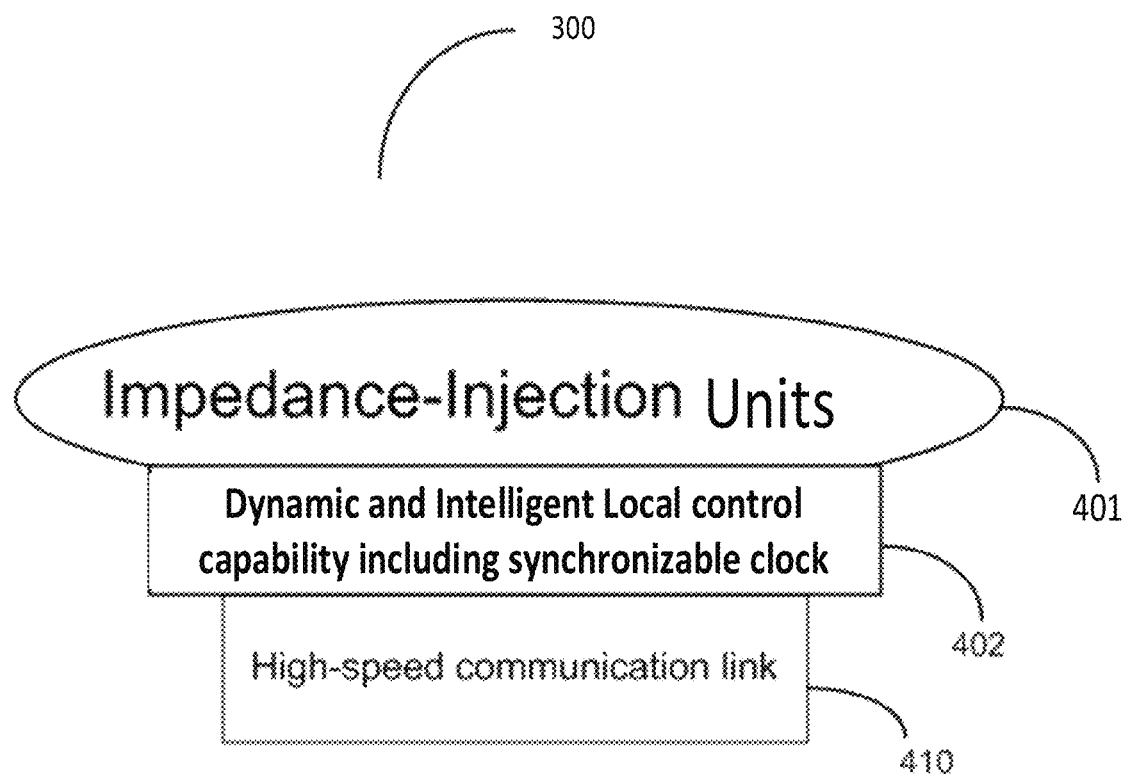
FIG. 2 is a block diagram illustrating a conventional dynamic intelligent impedance injection module with local and global time synchronization capability.
Figure 3A:
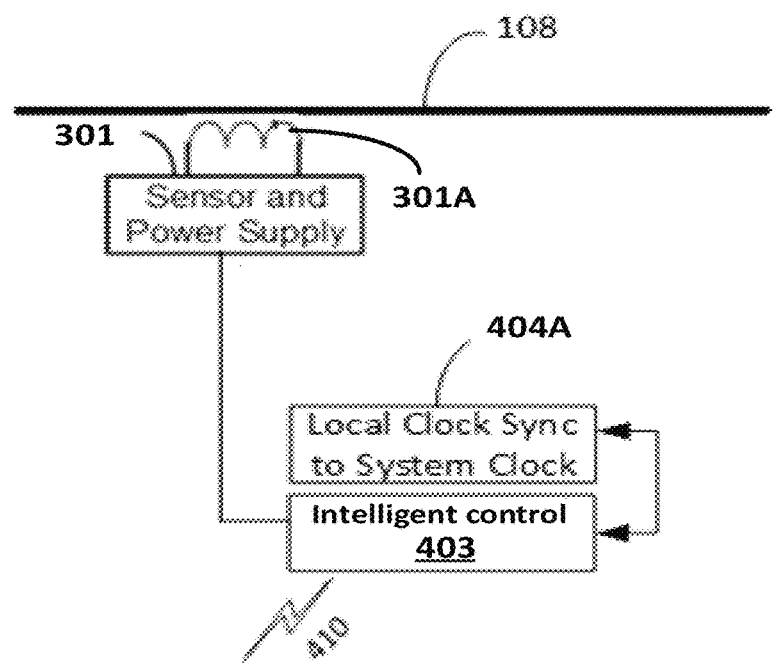
FIG. 3A is a circuit diagram illustrating a local master control module of a TL-FACTS based IIU having an associated local clock.
Figure 3B:
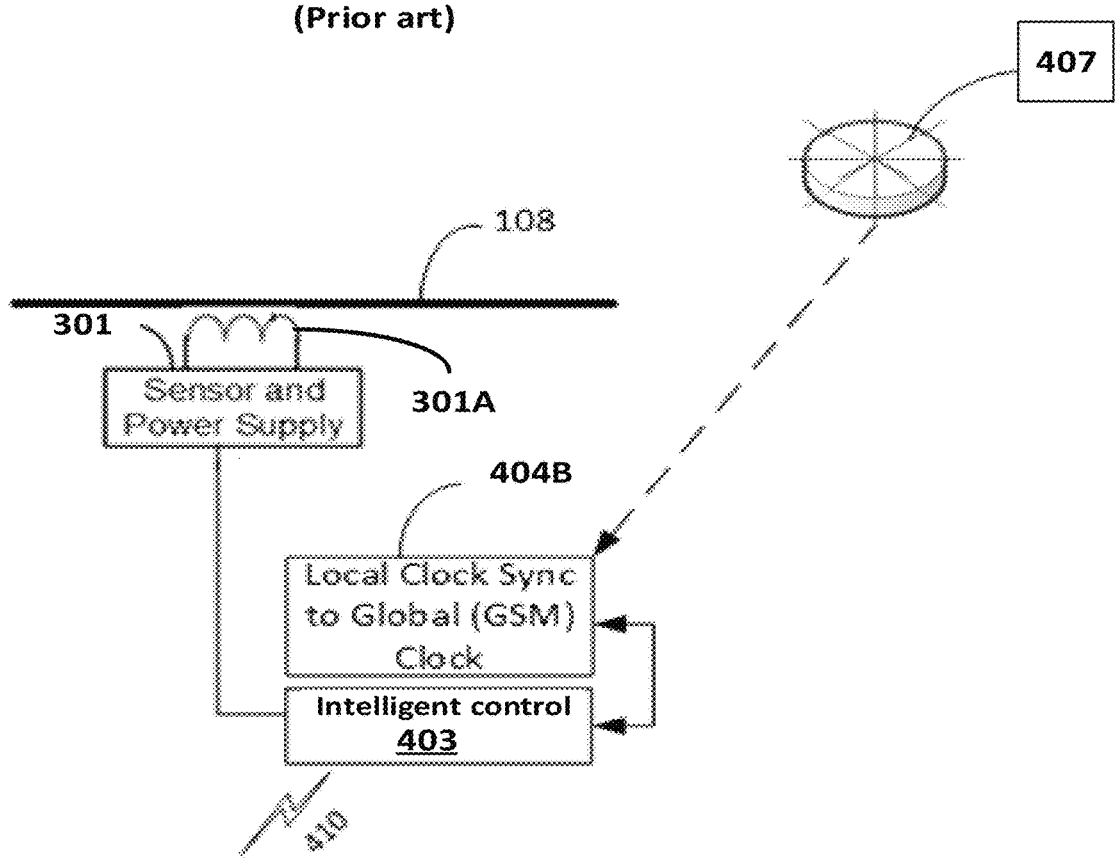
FIG. 3B is a circuit diagram illustrating a local master control module of a TL-FACTS based IIU having an associated local clock that can be synchronized to a global clock.
Figure 4:
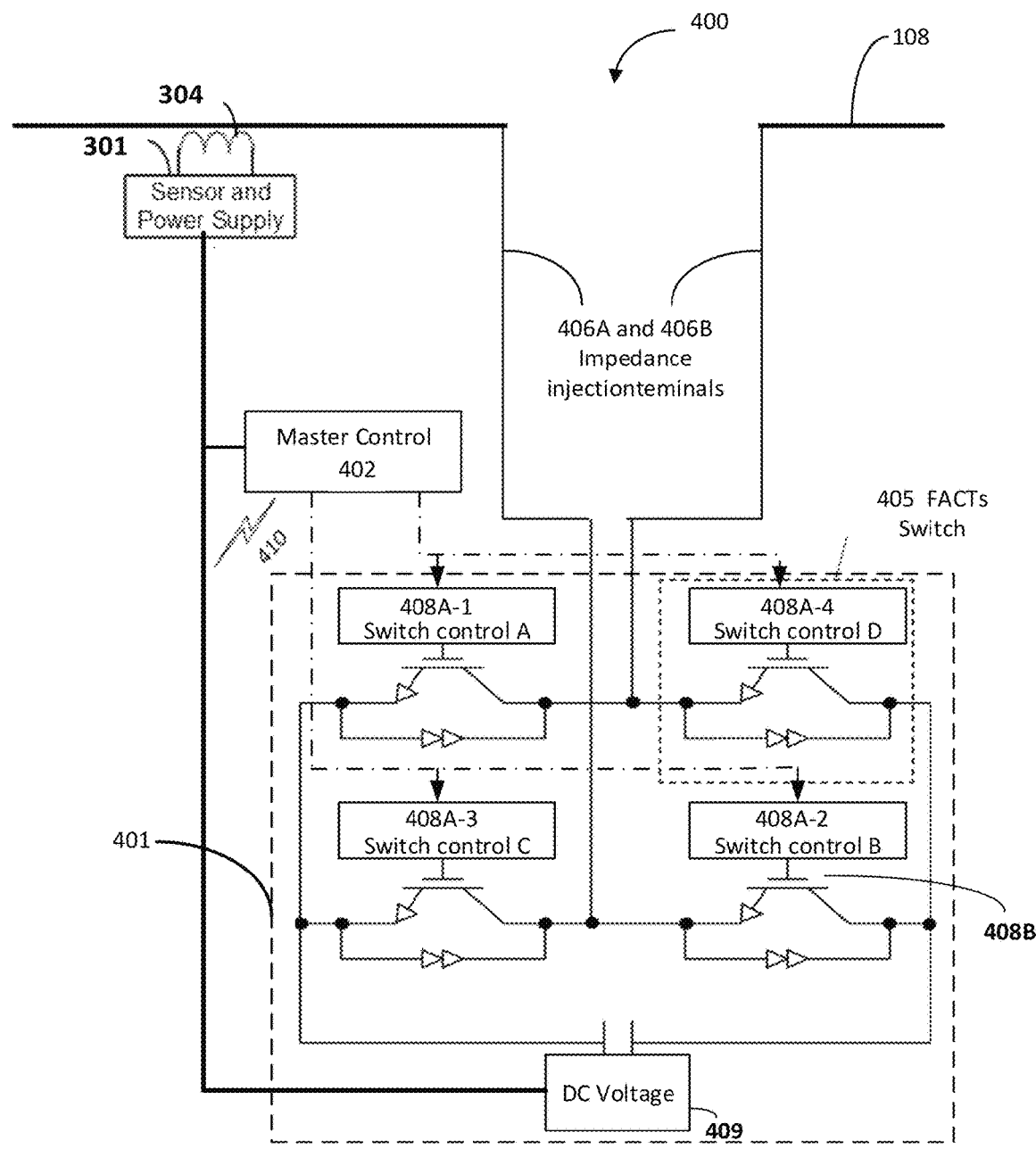
FIG. 4 is a circuit diagram illustrating a TL-FACTS based IIU, where one or more of the TL-FACTS based IIUs may constitute an IIM.

Various examples of implementation covering the aspects of the disclosures will be described below, and the accompanying drawings will illustrate these various implementation examples indicative of the unique and inventive nature of the disclosure. The following description and drawings are illustrative of the disclosure and are not to be construed as limiting the disclosure. Numerous specific details are described to provide a thorough understanding of various examples of the present disclosure. However, in certain instances, well-known or conventional details are not described in order to provide a concise discussion of the described example of the present disclosures.

Reference in the specification to "one example" or "an example" means that a particular feature, structure, or characteristic described in conjunction with the example can be included in at least one example description of the disclosure. The appearances of the phrase "in one example" in various places in the specification do not necessarily all refer to the same example.

According to some examples, intelligent impedance injection modules (IIMs) comprising connected transformer-less flexible alternating current transmission system (TL-FACTS) devices that are used as impedance injection units (IIUs) for control of high-voltage (HV) transmission lines. The IIUs generate and inject rectangular impedance waves (or waveforms) which, if cumulatively large when injected, create high-frequency oscillations that interfere with control systems on the HV transmission lines and user premises. By staggering and synchronizing the timing of the injection from the series connected IIUs or IIU groups, the injected waveform is converted to a pseudo-sinusoidal wave (or waveform) to reduce generation of harmonics. This method of injection can be optimized for the low harmonics generation using number of IIUs used. The number of IIUs may be reduced by generating and injecting a combination of standard synchronized and short pulses from IIUs.

In one aspect, a method for synchronized injection of impedance into high voltage (HV) transmission line is described. The method includes generating, by a plurality of impedance injection units (IIUs) coupled to the HV transmission line, impedance injection waves that cumulatively form a pseudo-sinusoidal wave. The method further includes optimizing, by the plurality of IIUs, the pseudo-sinusoidal wave to represent a pure sinusoidal wave. The method further includes injecting, by the plurality of IIUs, the pseudo-sinusoidal wave, as impedance, into the HV transmission line. The plurality of IIUs form multiple connection configurations in sequence, each connection configuration comprising one IIU or multiple IIUs in series, parallel or combination thereof, coupled to the HV transmission line.

In another aspect, a system for injecting impedance into a HV transmission line is described. The system includes a plurality of IIUs coupled to the HV transmission line. The IIUs form multiple connection configurations in sequence, with each connection configuration comprising one IIU or multiple IIUs in series, parallel or combination thereof, coupled to the HV transmission line. The IIUs are to generate impedance injection waves that cumulatively form a pseudo-sinusoidal wave, optimize the pseudo-sinusoidal wave to represent a pure sinusoidal wave, and inject the pseudo-sinusoidal wave, as impedance, into the HV transmission line.

Other aspects and advantages of the disclosure will become apparent from the following detailed description taken in conjunction with the accompanying drawings which illustrate, by way of example, the principles of the described disclosure covered.

Figure 5:
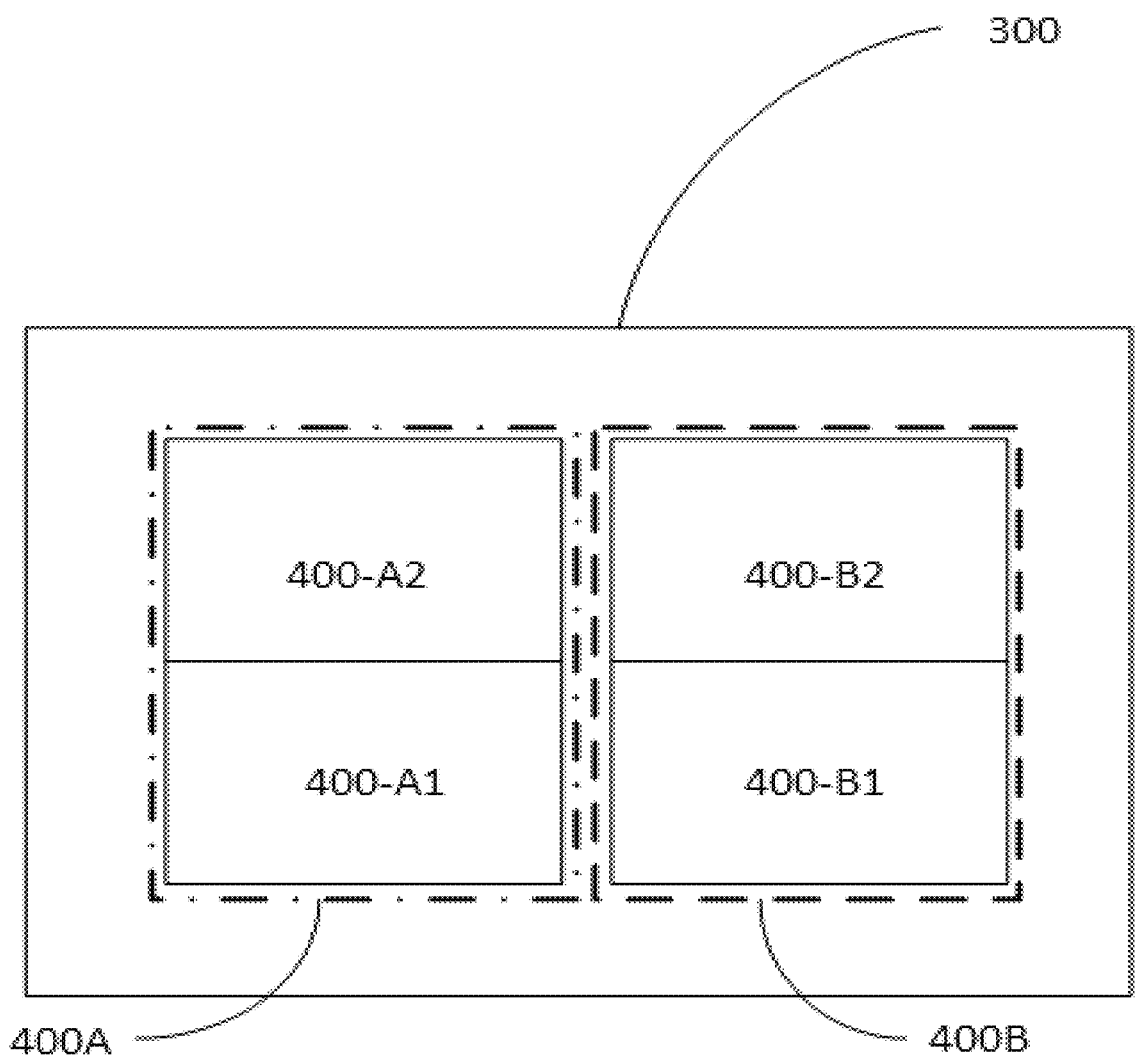
FIG. 5 is a block diagram illustrating an IIM having a 2×2 series-parallel connection comprising four TL-FACTS based IIUs.
Figure 6:
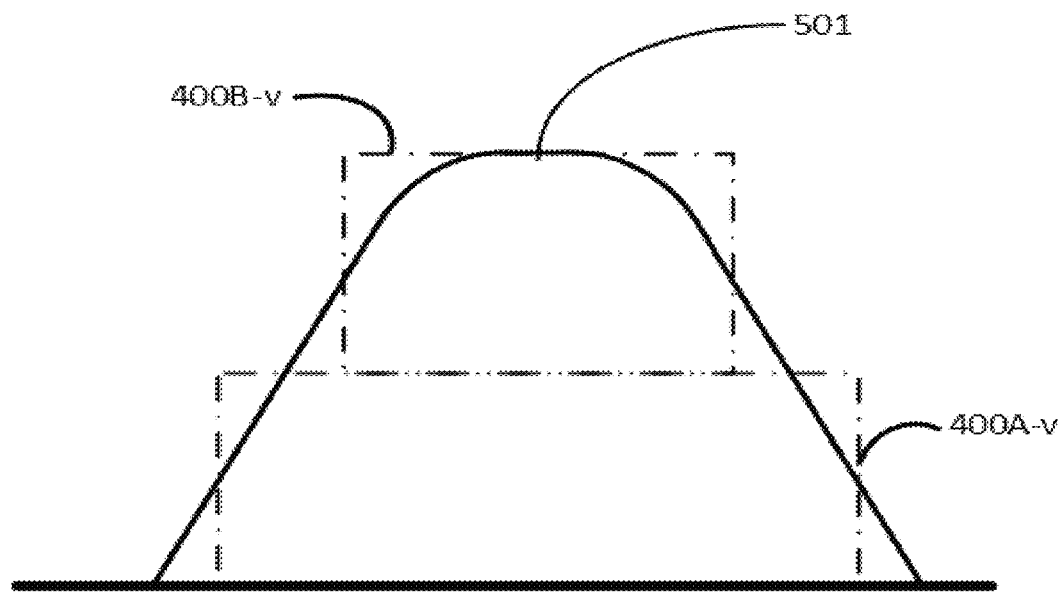
FIG. 6 is a diagram illustrating a pseudo-sinusoidal waveform generated by an IIM having two sets of parallel connected TL-FACTS based IIUs interconnected in series a 2×2 matrix of FIG. 5 that provide two rectangular waveforms from the two sets of series connected IIUs 400 in a synchronized fashion that when combined generate the pseudo-sinusoidal waveform for injection into an HV transmission line.
Figure 6A:
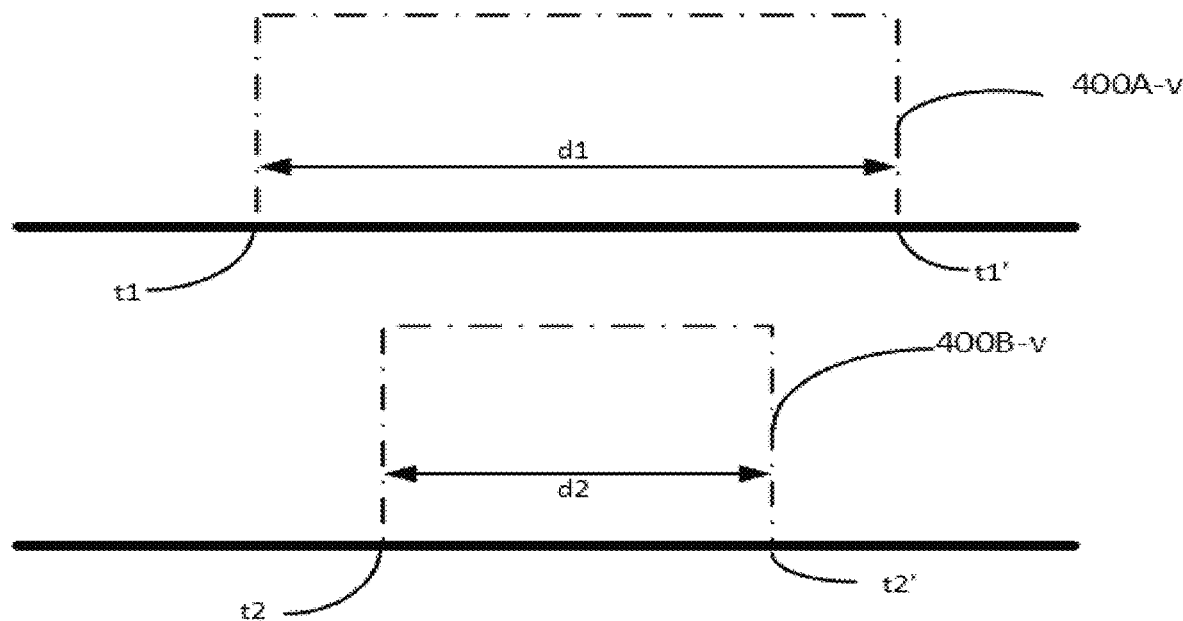
FIG. 6A shows synchronously generated and injected rectangular waveforms from each of the two series connected groups of two parallel connected IIUs of FIG. 5.

As previously discussed, it is optimum if the generated waveforms from the IIUs 400 of the IIM 300 can be adjusted to represent a pseudo-sinusoidal impedance waveform that represent a pure sinusoidal waveform when cumulatively injected into the HV transmission line 108. Such an optimization can be performed using only a reasonable number of IIUs. Referring again to FIG. 5, IIM 300 may comprise one or more IIUs 400 that are connected in series, parallel or series-parallel connections. A set of start time-synchronized and duration-adjusted waveforms generated by four IIUs 400s connected in a 2×2 array of FIG. 5 is shown in FIG. 6. The 2×2 connected array of IIUs 400 of the IIM 300 comprise four IIUs, with the first two IIUs 400-A1 and 400-A2 forming a first parallel connected IIU group 400A and the second two IIUs 400-B1 and 400-B2 forming a second parallel IIU group 400B. The waveforms generated by IIU groups 400A and 400B are synchronized to start, end and have same amplitude. The two parallel connected IIU groups 400A and 400B are connected in series to form the IIM 300 of FIG. 5. The IIM 300 is able to generate impedance injection waveforms 400A-v and 400B-v (as shown in FIG. 6A), with 400A-v having a start at time t1 and an end time t1' with a duration d1, and 400B-v having a start time at t2 and an end time t2' with a duration d2, which is less than d1. The two waveforms are cumulative when injected into an HV transmission line (as the two parallel connected IIU groups 400A and 400B) and generally would smooth out to a sinusoidal waveform 501 (shown in FIG. 6).

Figure 7:
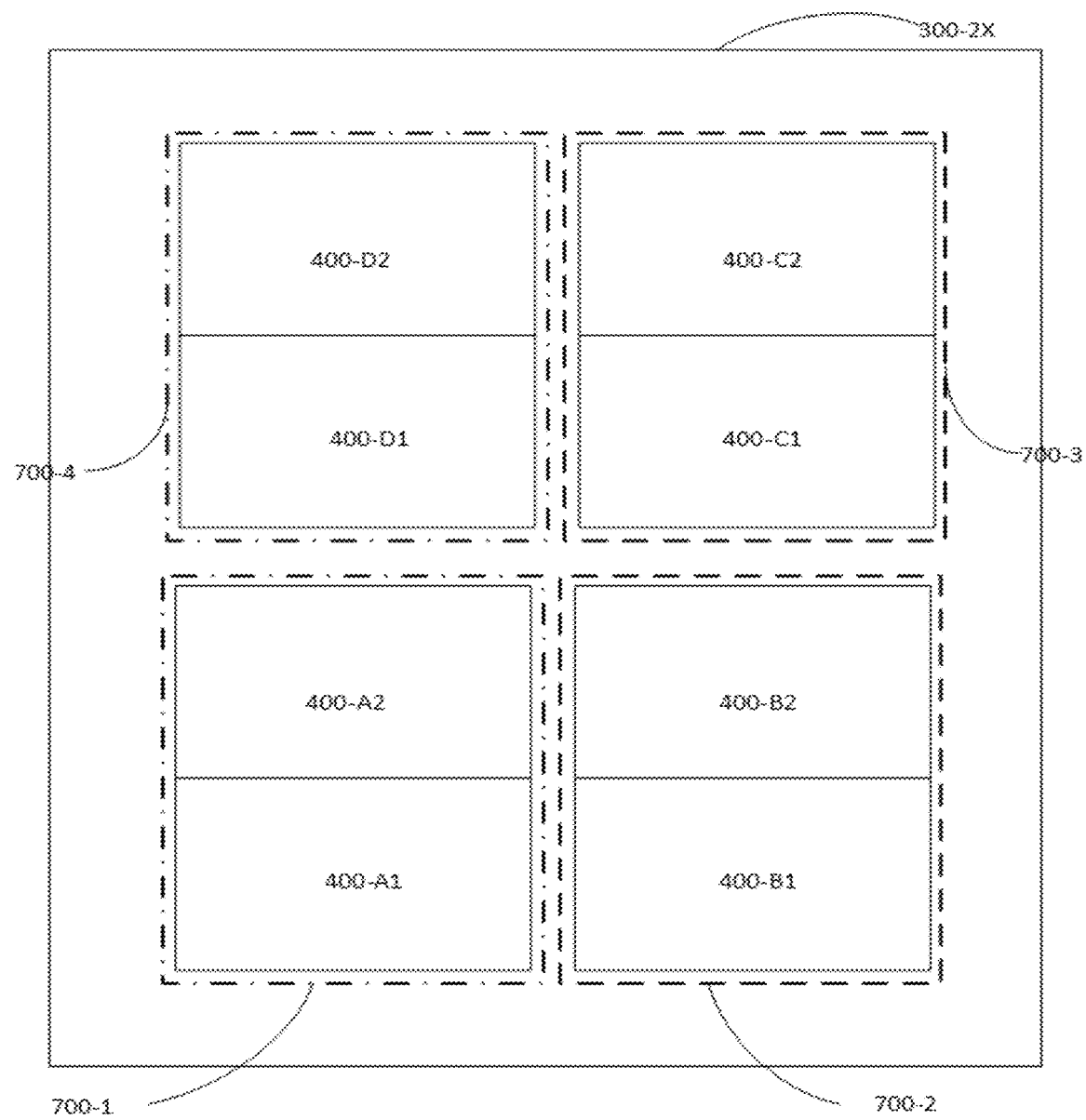
FIG. 7 shows eight IIUs configured in four parallel groups, with each group having two IIUs in parallel and the four groups connecting in series to form an IIM according to an embodiment.

FIG. 7 shows eight IIUs configured in four parallel groups, with each group having two IIUs in parallel and the four groups connecting in series to form an IIM according to an embodiment. Referring to FIG. 7, IIM 300-2X may comprise a 4×2 combination, such as four groups of two IIUs 400 in parallel, with the four groups connecting in series to form the IIM 300-2X. That is, each of the four IIU groups 700-1 to 700-4 is formed by paralleling two IIUs 400 (e.g., IIU 400-A1 and IIU 400-A2, IIU 400-B1 and IIU 400-B2, IIU 400-C1 and IIU 400-C2, or IIU 400-D1 and IIU 400-D2). It is noted that while FIG. 7 shows two IIUs 400 included in each IIU group, any number of IIUs 400 may be included in the IIU group. It is also noted that while FIG. 7 shows four IIU groups 700-1 to 700-4 included in IIM 300-2X, any number of IIU groups may be included in IIM 300-2X.

Figure 7A:
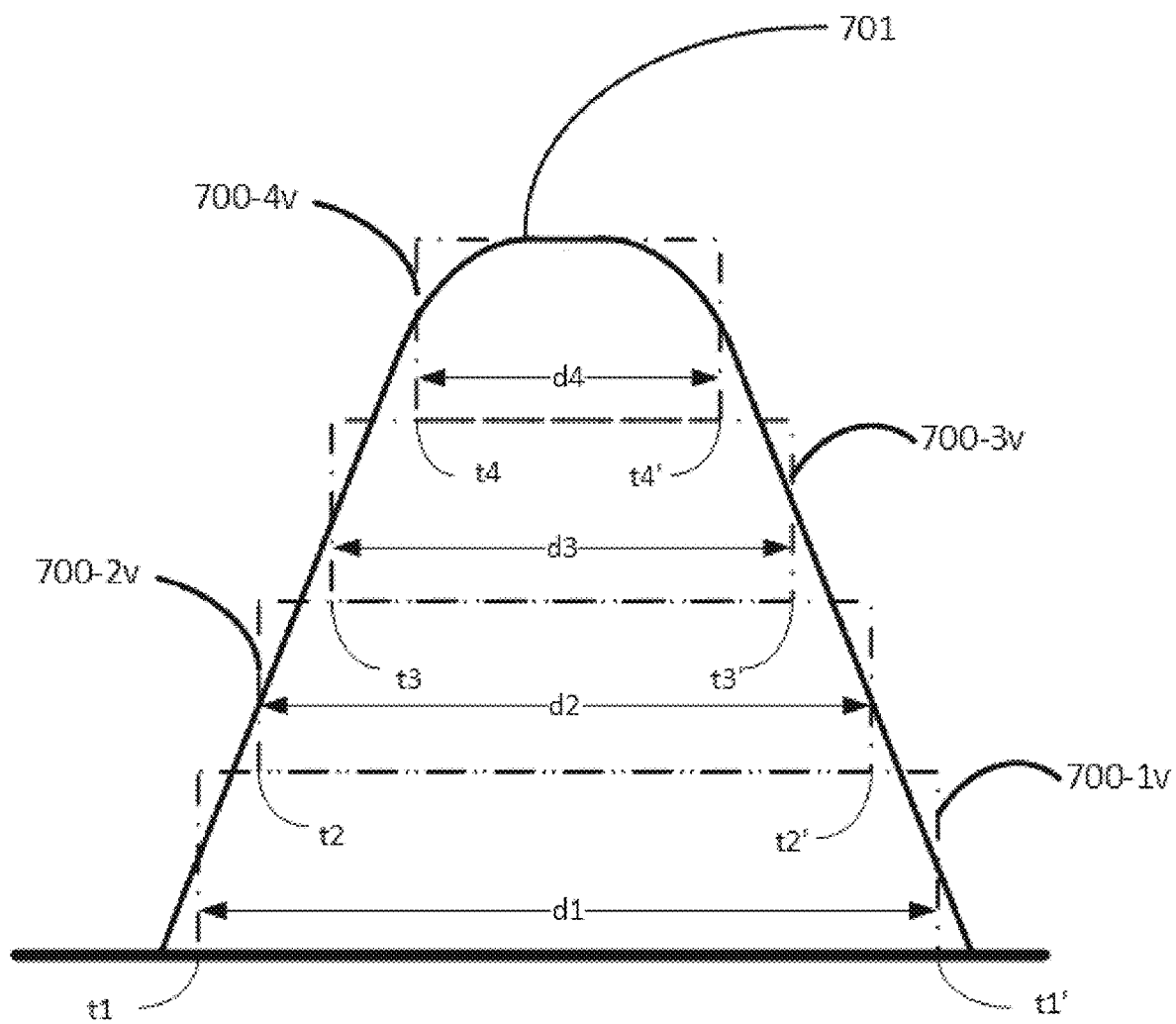
FIG. 7A shows an injected output waveform from the four groups of two IIUs of FIG. 7 with their injection start and end times adjusted in a synchronized fashion to generate a pseudo sinusoidal waveform that smooths to a sinusoidal waveform when injected into a HV transmission line according to an embodiment.

With continued reference to FIG. 7, IIU group 700-1 may include IIUs 400-A1 and 400-A2 connected in parallel, IIU group 700-2 may include IIU 400-B1 and 400-B2 connected in parallel, IIU group 700-3 may include IIUs 400-C1 and 400-C2 connected in parallel, and IIU group 700-4 may include IIU 400-D1 and 400-D2 connected in parallel. The parallel-connected groups of IIUs 700-1 to 700-4 may be connected in series to generate impedances 700-1v to 700-4v (shown in FIG. 7A) to be injected into an HV transmission line (e.g., HV transmission line 108). The individual injected impedances 700-1v to 700-4v may have start times staggered as t1, t2, t3 and t4 and end times staggered as t1', t2', t3' and t4' providing injection durations d1, d2, d3 and d4, respectively, as shown in FIG. 7A. These impedances, when injected into the HV transmission line, cumulatively combine to provide a pseudo-sinusoidal waveform that may be smoothed to produce sinusoidal waveform 701 due to the impedance of the HV transmission line (as shown in FIG. 7A).

Figure 8:
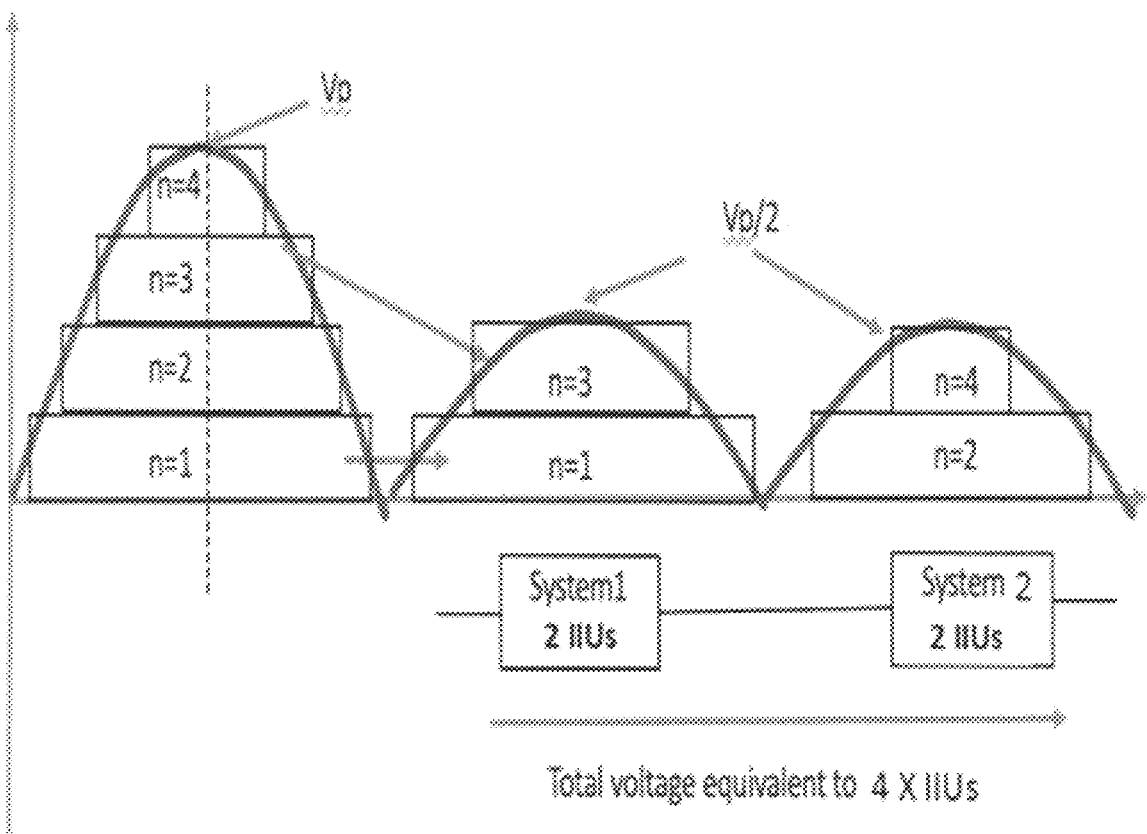
FIG. 8 shows an injected pseudo-sinusoidal impedance waveform generated by IIMs connected in series provide a capability to generate a synchronized combinable step injection according to an embodiment.

FIG. 8 shows an injected pseudo-sinusoidal impedance waveform generated by IIMs connected in series provide a capability to generate a synchronized combinable step injection according to an embodiment. Where the number of IIUs 400 in an IIM 300 is not sufficient to create the required impedance injection wave form, IIUs from multiple IIMs 300 in a neighborhood, operating in synchronous fashion. In such a case one designated control in one IIM 300 act as master controller with other controllers in the rest of the multiple IIMs 300 as slave controllers. As an example, in FIG. 8, two serially distributed IIMs (labelled as "System 1" and "System 2") are used on a HV transmission line, with each IIM comprising 2×2 IIUs (e.g., IIU 400), as shown in FIG. 5, to generate a sinusoidal impedance injection that is equivalent to the having four IIUs connected in series to be injected into the HV transmission line to which the IIMs are connected and coupled.

Figures 9, 9A:
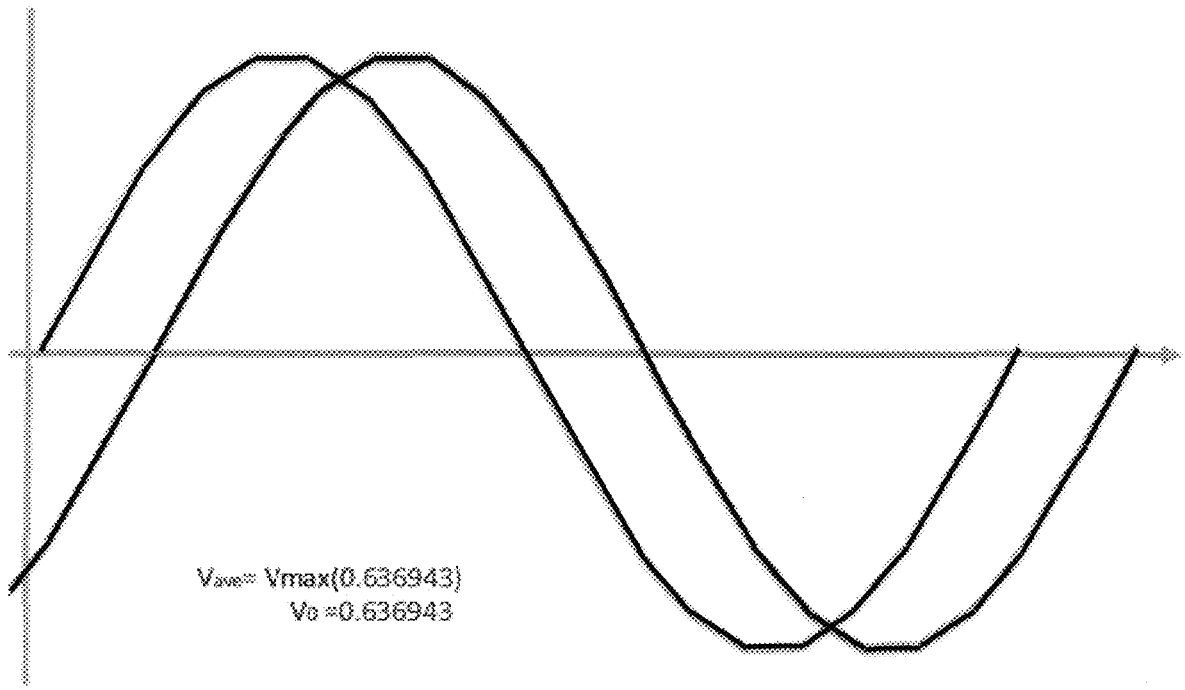
FIG. 9 shows a pure sine wave and a root-mean-squared (RMS) and average values associated with the sine wave.
FIG. 9A is a table showing the relationship of values of a sinusoidal waveform.

FIGS. 9 and 9A show a pure sinusoidal waveform with an RMS and average values of the sinusoidal waveform and the relationship between the values for comparison to an injected pseudo-sinusoidal wave, which may be smoothed out by the inductance of the HV transmission line. The RMS value of the sinusoidal wave having a peak value A is $\{(1/SQRT\ 2)*A\}=0.707$ A and the average value=2 $A/\Pi=0.636943$ or 0.637 A. For a voltage waveform, the peak value A is typically designated as Vp, as is understandable by people skilled in the art. The closer the RMS or average values of the pseudo-sinusoidal wave can be made to the pure sinusoidal waveform, the lower will be the tendency for harmonic frequency related oscillations be initiated on the HV transmission line due to the injected impedance waveform. Similarly, by reducing the amplitude of the steps of rectangular injected impedance voltages, it is possible to reduce the amplitude of the distortion resulting in reducing the tendency for instability on the HV transmission lines due to the injected impedance wave form.

Figure 10A:
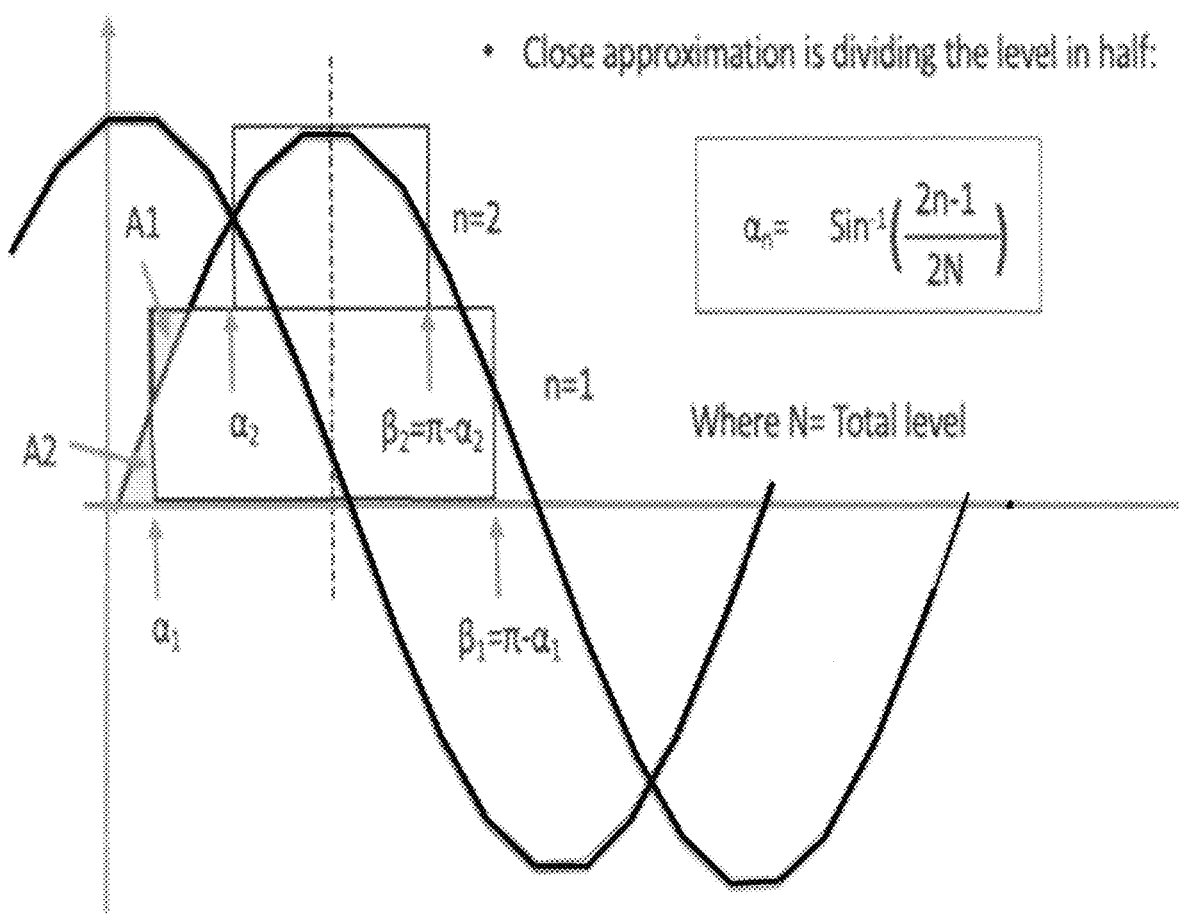
FIG. 10A is a diagram showing the impact of stepped generation and injection of impedance conforming to a pseudo sinusoidal voltage on a harmonic injection on HV power transmission lines.

FIG. 10A is a diagram showing the impact of stepped generation and injection of impedance conforming to a pseudo sinusoidal voltage on a harmonic injection on HV power transmission lines. More specifically, FIG. 10 shows how generated stepped waveforms from series connected IIUs or IIU groups can be implemented to achieve optimal smoothing and spacing for optimizing a pseudo sinusoidal output to a HV transmission line. As indicated in FIG. 10A, the smoothing of the waveform is optimally performed when an area A1 is equal to an area A2 in FIG. 10A, such that they compensate one another, and the start and stop times of the steps implemented follow the rule for start time=$\alpha_n$ for the $n^{th}$ step=$\sin^{-1}\{(2n-1)/2n\}$ and the stop time=$\beta_n$ for the $n^{th}$ step=$\Pi-\sin^{-1}\{(2n-1)/2n\}=\Pi-\alpha_n$. This provides for an optimum pseudo sinusoidal waveform to be injected into the HV transmission line with a plurality of 'n' IIUs 400 or 'n' sub-groups of parallel connected IIUs 400, connected in series and each IIU or IIU sub-group generating impedance waveform of equal amplitude as shown in FIG. 10A.

Figure 10B:
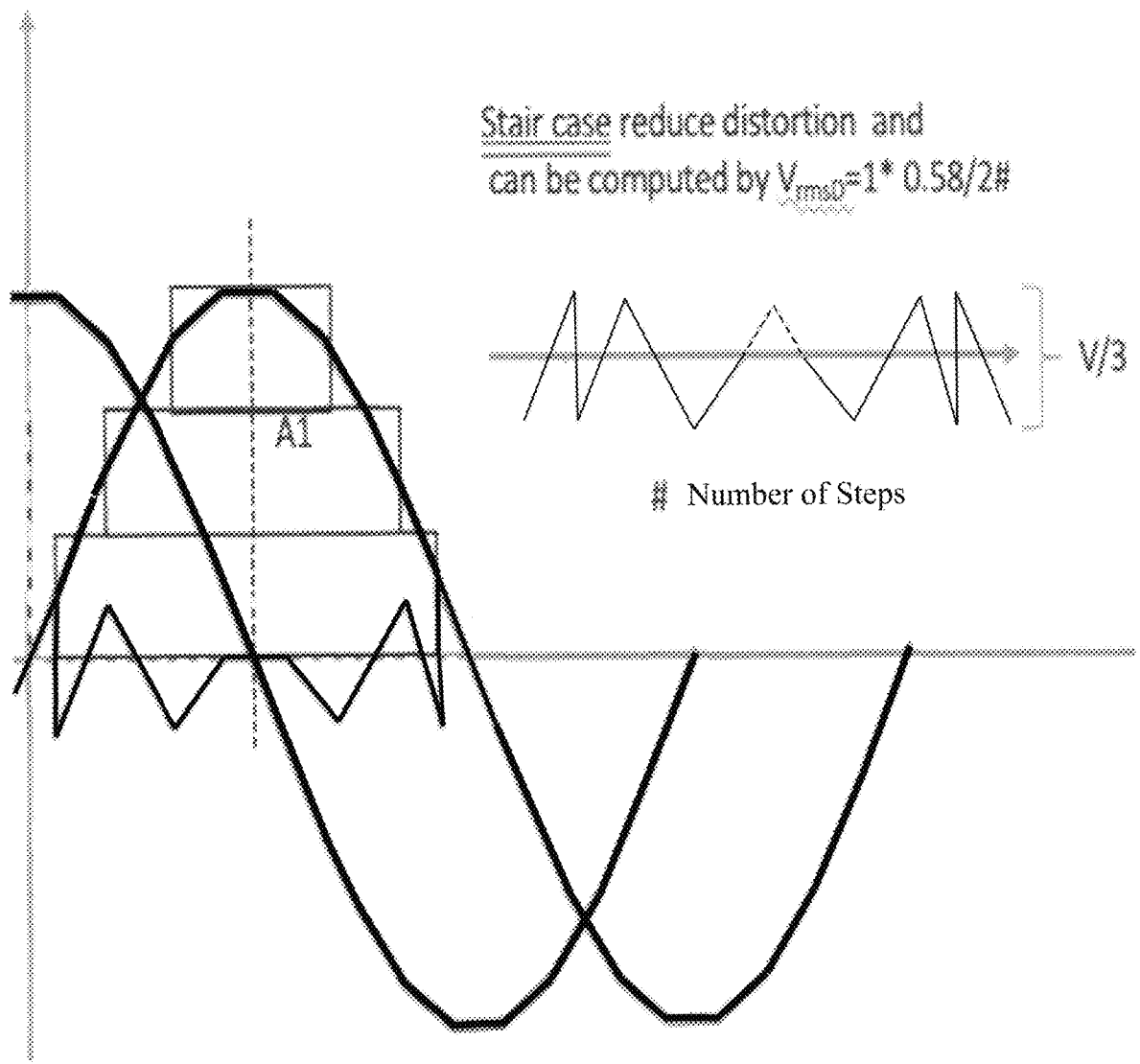
FIG. 10B is a diagram showing the impact of stepped generation and injection of impedance conforming to a pseudo sinusoidal voltage on a distortion injected on the HV power transmission lines due to the lower voltage at each staggered step in a pseudo-sinusoidal waveform.

FIG. 10B is a diagram showing the impact of increasing the number of IIUs 400 or sub-groups of parallel connected IIUs that generate rectangular waveforms to be injected as a pseudo-sinusoidal waveform into HV transmission lines. As these generated and injected rectangular impedances are synchronized and staggered in time, the step heights in the injected waveform is made small. By increasing the number of generated rectangular waveforms of equal amplitude to be injected, the amplitude of each step is reduced and staggered to achieve a required pseudo-sinusoidal injected impedance. This reduction in the injected step voltage in turn reduces the amplitude of the distortion as the RMS value of the distortion injected is dependent on the magnitude of each staggered step forming the injected waveform. The RMS value of distortion injected can be computed as $V_{RMSD}=0.58\ Vp/2n$ Where Vp is the peak value of injected impedance; n is the number of IIU sub-groups connected in series, with each IIU sub-group injecting equal amplitude rectangular impedance waveforms.

Figure 11A:
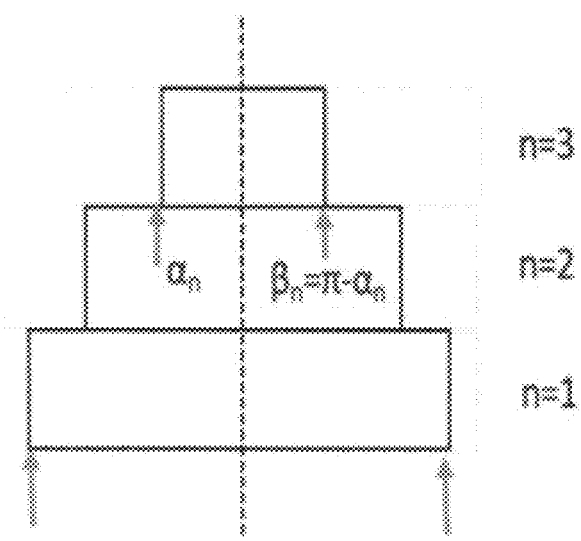
FIGS. 11A and 11B are diagrams showing the impact on an ideality factor measured by an average value of the pseudo-sinusoidal waveform due to an increasing number of IIU sub-groups generating and injecting the impedance.
Figure 11B:
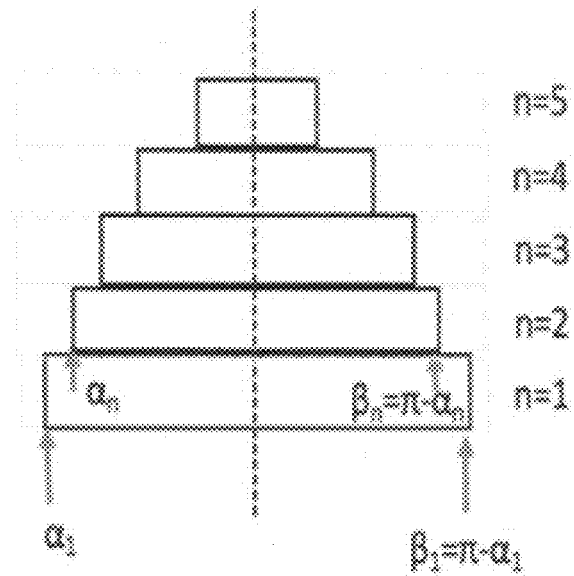

FIGS. 11A and 11B show the impact of increasing the number of IIU sub-groups connected in series to generate and inject impedance of equal amplitude into a HV power transmission line. FIG. 11A shows subgroup of two (N=2) and three (N=3) in series injecting the impedance waveform, which results in ideality factors of a pseudo-sinusoidal waveform measured as an average value Vo of the injected smoothed waveform. Ideality factor (IF) refers to a measure of how closely the injected pseudo-sinusoidal waveform is to a pure sinusoidal waveform. The IF is measured as the average value $V_{avg}$ of the pseudo-sinusoidal waveform injected.

FIG. 11C is a table showing the improvement of the factor Vo as the number of ITU sub-groups injecting the impedance increases from 2 to 5. As can be clearly seen, by going from two impedance injecting sub-groups to five impedance injecting sub-groups, the ideality factor of the injected pseudo-sinusoidal waveform improves and becomes close to the optimum ideality factor IFopt=0.636943. The ideality factor IFn for 'n' sub groups of injectors improve from 0.649623 for n=2 to 0.640485 for n=5. It is hence clear that having a larger number of rectangular injected waveforms combining to have smaller step heights in the resulting pseudo-sinusoidal waveform is necessary to reduce the oscillations on the HV transmission line due to the impedance injection.

One of the difficulties of using a large number of injecting sub-groups of IIUs is the increased cost and weight of the resulting IIMs (e.g., TIM 300). It has been proposed to use short duration pulses in order to improve the efficiency of injection, that is use of reduced number of IIU subgroups, while retaining the advantage of larger number of steps of smaller amplitude in a pseudo-sinusoidal injected waveform. By adding short pulse capability to one of the IIUs with n>1 total IIUs in series, as described in more detail herein below, an equivalent number of 2n−1 steps can be achieved.

Figure 12:
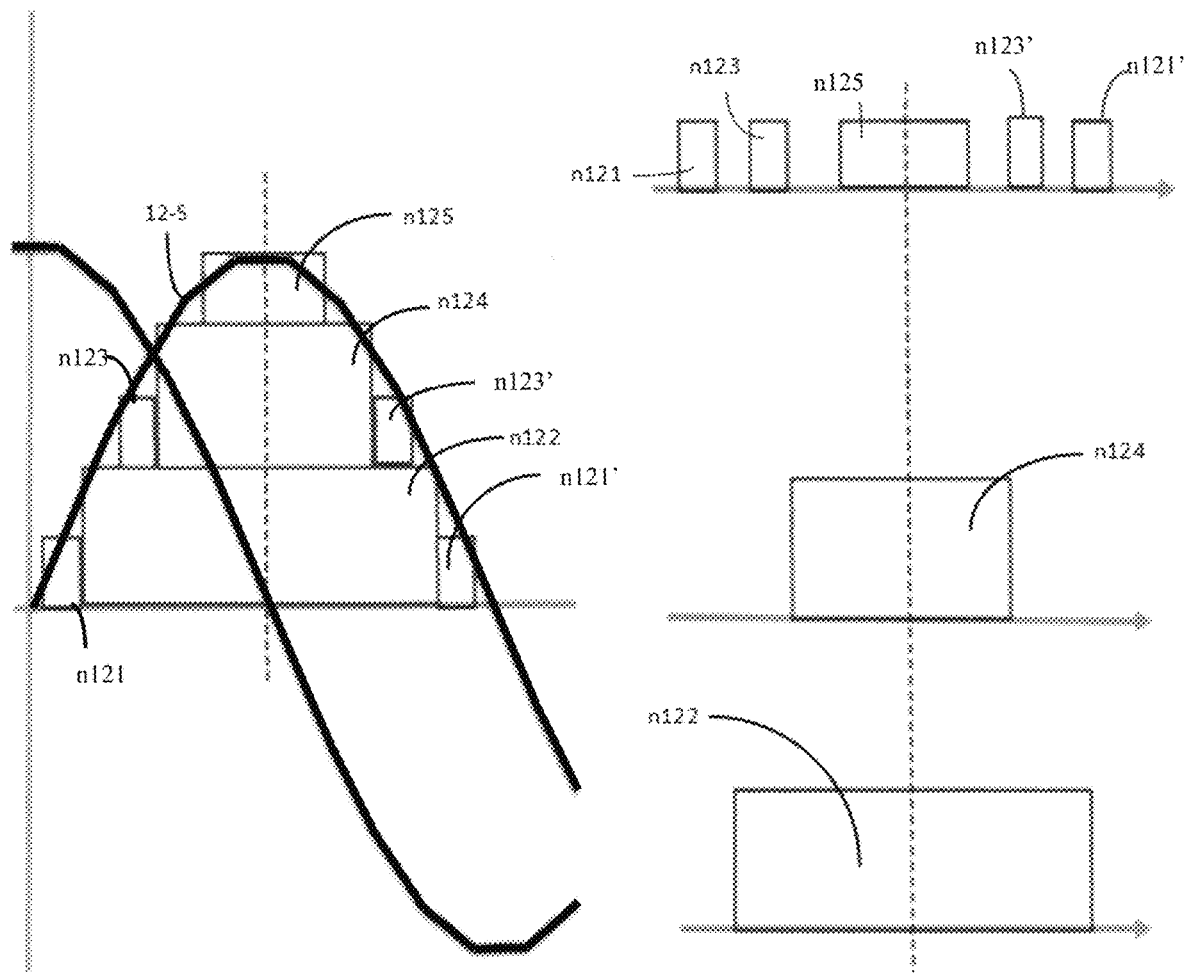
FIG. 12 is an example implementation using a short pulse injection to improve the ideality factor of an injected waveform using a lower number impedance injecting sub-groups than a number of steps in the injected waveform according to an embodiment.

FIG. 12 is a diagram showing the use of a short pulse to reduce the number of injecting sub-groups of IIUs. By using 'n' IIU sub-groups, a waveform having 2n−1 steps can be generated by this method. That is, by having 3 sub-groups, an equivalent injection ideality factor of 'n'=5, IF5=0.640485 can be achieved. In FIG. 12, "s" represents the duration of a short pulse waveform generated during an unused period.

Of the three IIU sub-groups injectors, two subgroup 1 and a subgroup 2 inject an impedance of double the amplitude of each step, as indicated in n122 and n124 respectively. The third IIU sub-group injects short pulses n121, n121', n123, n123' and n125 that have half the amplitude of the pulses n122 and n124. The injected pulses are synchronized in time and staggered such that they are combined to produce a waveform having a maximum step height that is the larger of the height of the short pulses or the difference between the short pulse height and the step height of the large injected rectangular waveform. By aligning the short pulse n121 and n121' on either side of the larger n122 and similarly aligning n123 and n123' on either side of n124 the step height seen by the injected waveform is reduced and is similar to having five sub-groups of injectors injecting the impedance waveform of amplitude $V_i$. Hence with three injecting sub-groups an effective five step waveform can be generated reducing the cost and weight of the distributed IIMs 300 used.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A method for synchronized injection of impedance into high voltage (HV) transmission line, the method comprising:
generating, by a plurality of impedance injection units (IIUs) coupled to the HV transmission line, impedance injection waves that cumulatively form a pseudo-sinusoidal wave, wherein the impedance injection waves comprise a first subgroup of one or more impedance injection waves and a second subgroup of one or more impedance injection waves;
aligning and synchronizing, by the plurality of IIUs, the first and second subgroups of impedance injection waves with each other to reduce a step height of the pseudo-sinusoidal wave, the first subgroup of impedance injection waves each having an amplitude greater than an amplitude of each of the second subgroup of impedance injection waves; and
injecting, by the plurality of IIUs, the pseudo-sinusoidal wave, as impedance, into the HV transmission line;
wherein the plurality of IIUs form multiple connection configurations in sequence, each connection configuration comprising one IIU or multiple IIUs in series, parallel or combination thereof, coupled to the HV transmission line.

2. The method of claim 1, wherein the pseudo-sinusoidal wave has a root-mean-squared (RMS) value or an average value about a RMS value or average value of a pure sinusoidal wave.

3. The method of claim 1, wherein the first subgroup of impedance injection waves each having a duration greater than a duration of each of the second subgroup of impedance injection waves.

4. The method of claim 1, wherein each of the impedance injection waves is generated at a start time=$\sin^{-1}\{(2n-1)/2n\}$ and a stop time=$\Pi-\sin^{-1}\{(2n-1)/2n\}$, wherein n is a step in the pseudo-sinusoidal wave.

5. The method of claim 1, wherein an ideality factor of the pseudo-sinusoidal wave is about an average value of a pure sinusoidal wave.

6. The method of claim 1, wherein the amplitude of the second subgroup of impedance injection waves is half of the amplitude of the first subgroup of impedance injection waves.

7. The method of claim 1, wherein the plurality of IIUs comprise a first subgroup of IIUs that generates the first subgroup of impedance injection waves, and a second subgroup of IIUs that generates the second subgroup of impedance injection waves.

8. The method of claim 1, wherein aligning and synchronizing the first and second subgroups of impedance injection waves with each other comprises aligning each impedance injection wave of the second subgroup of impedance injection waves on a left side or a right side of an impedance injection wave of the first subgroup of impedance injection waves.

9. The method of claim 1, wherein the pseudo-sinusoidal wave reduces generation of oscillations, harmonics and distortion on the HV transmission line, as compared to injection of a single impedance injection wave.

10. A system for injecting impedance into a high voltage (HV) transmission line, the system comprising:
a plurality of impedance injection units (IIUs) coupled to the HV transmission line, the plurality of IIUs forming multiple connection configurations in sequence, each connection configuration comprising one IIU or multiple IIUs in series, parallel or combination thereof, coupled to the HV transmission line;
wherein the plurality of impedance injection units (IIUs) are to:
generate impedance injection waves that cumulatively form a pseudo-sinusoidal wave, wherein the impedance injection waves comprise a first subgroup of one or more impedance injection waves and a second subgroup of one or more impedance injection waves,
align and synchronize the first and second subgroups of impedance injection waves with each other to reduce a step height of the pseudo-sinusoidal wave, the first subgroup of impedance injection waves each having an amplitude greater than an amplitude of each of the second subgroup of impedance injection waves, and
inject the pseudo-sinusoidal wave, as impedance, into the HV transmission line.

11. The system of claim 10, wherein the pseudo-sinusoidal wave has a root-mean-squared (RMS) value or an average value about a RMS value or average value of the pure sinusoidal wave.

12. The system of claim 10, wherein the first subgroup of impedance injection waves each having a duration greater than a duration of each of the second subgroup of impedance injection waves.

13. The system of claim 10, wherein each of the impedance injection waves is generated at a start time=$\sin^{-1}\{(2n-1)/2n\}$ and a stop time=$\Pi-\sin^{-1}\{(2n-1)/2n\}$, wherein n is a step in the pseudo-sinusoidal wave.

14. The system of claim 10, wherein an ideality factor of the pseudo-sinusoidal wave is about an average value of a pure sinusoidal wave.

15. The system of claim 10, wherein the amplitude of the second subgroup of impedance injection waves is half of the amplitude of the first subgroup of impedance injection waves.

16. The system of claim 10, wherein the plurality of IIUs comprise a first subgroup of IIUs that generates the first subgroup of impedance injection waves, and a second subgroup of IIUs that generates the second subgroup of impedance injection waves.

17. The system of claim 10, wherein to align and synchronize the first and second subgroups of impedance injection waves with each other, the plurality of IIUs align each impedance injection wave of the second subgroup of impedance injection waves on a left side or a right side of an impedance injection wave of the first subgroup of impedance injection waves.

18. The system of claim 10, wherein the pseudo-sinusoidal wave reduces generation of oscillations, harmonics and distortion on the HV transmission line, as compared to injection of a single impedance injection wave.

\* \* \* \* \*